(12) United States Patent
Egan et al.

(10) Patent No.: US 8,742,778 B2
(45) Date of Patent: Jun. 3, 2014

(54) TESTING PROTECTION SCHEMES OF A POWER CONVERTER

(75) Inventors: Patrick K. Egan, Rochester, MN (US);
Brian J. Hruby, Rochester, MN (US);
Michael L. Miller, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 13/352,566

(22) Filed: Jan. 18, 2012

(65) Prior Publication Data

US 2013/0181729 A1   Jul. 18, 2013

(51) Int. Cl.
*G01R 31/00* (2006.01)

(52) U.S. Cl.
USPC ............ 324/750.01; 324/764.01; 324/762.08; 324/601; 363/97; 363/15; 363/95; 363/127; 363/21.13; 327/535; 327/537

(58) Field of Classification Search
USPC .......... 324/750.01, 764.01, 771, 769, 762.08, 324/762.09, 601; 363/65, 97, 15, 95, 127, 363/21.13, 34, 140, 21.01–21.09, 21.18; 323/224, 282–286, 222
See application file for complete search history.

(56) References Cited

U.S. PATENT DOCUMENTS

| | | | |
|---|---|---|---|
| 5,363,039 A | | 11/1994 | Kumar et al. |
| 5,991,181 A | | 11/1999 | Fujii et al. |
| 6,301,133 B1 | * | 10/2001 | Cuadra et al. ................... 363/65 |
| 6,331,941 B1 | | 12/2001 | Smith |
| 6,469,520 B1 | | 10/2002 | Arguelles-Paneda |
| 6,919,758 B1 | * | 7/2005 | Preslar et al. ................. 327/541 |
| 7,227,366 B2 | | 6/2007 | Rozen et al. |
| 7,256,605 B2 | | 8/2007 | Ball |
| 7,486,099 B1 | | 2/2009 | Manika |
| 7,498,778 B2 | * | 3/2009 | Seiersen ........................ 323/269 |
| 7,636,011 B2 | * | 12/2009 | Frederick et al. ............. 327/541 |
| 7,795,849 B2 | * | 9/2010 | Sohma .......................... 323/271 |
| 8,077,486 B2 | * | 12/2011 | Djenguerian et al. ..... 363/21.12 |
| 8,233,293 B2 | * | 7/2012 | Selvaraju et al. .......... 363/21.14 |
| 8,508,209 B2 | * | 8/2013 | Wang et al. ................... 323/285 |

(Continued)

FOREIGN PATENT DOCUMENTS

JP    04049811    2/1992

OTHER PUBLICATIONS

Ebrahim et al., "Fault Analysis of Current-Controlled PWM-Inverter Fed Induction-Motor Drives" Proceedings of the 7th International Conference on Properties and Applications of Dielectric Materials, Jun. 1-5, 2003, pp. 1065-1070 [online], [retrieved on Dec. 9, 2011]. Retrieved from the Internet <URL: http://ieeexplore.ieee.org/stamp/stamp.jsp?tp=&arnumber=1218607>.

(Continued)

*Primary Examiner* — Tung X Nguyen
*Assistant Examiner* — Thang Le
(74) *Attorney, Agent, or Firm* — Jason Sosa

(57) ABSTRACT

A system for testing the existing protection schemes of a power converter. The system simulates the voltage regulator producing a voltage level below an under-voltage threshold. The system simulates the voltage regulator producing a voltage level above an over-voltage threshold. The system simulates a short in the power converter pulling down the input bus. The system simulates a short in the power converter pulling down the output bus. The system measures the system responses to these simulations against responses of a properly operating system and determines if the power converter's protection schemes are operating correctly.

22 Claims, 9 Drawing Sheets

(56) References Cited

U.S. PATENT DOCUMENTS

| | | | |
|---|---|---|---|
| 2005/0285579 A1* | 12/2005 | Yasukouchi et al. | 323/282 |
| 2005/0285661 A1* | 12/2005 | Wittenbreder, Jr. | 327/434 |
| 2007/0041221 A1* | 2/2007 | Phadke et al. | 363/16 |
| 2007/0090821 A1* | 4/2007 | Imai et al. | 323/284 |
| 2008/0012542 A1* | 1/2008 | Liu et al. | 323/271 |
| 2008/0164759 A1* | 7/2008 | Sharma et al. | 307/52 |
| 2010/0164735 A1 | 7/2010 | Hartman et al. | |
| 2010/0283442 A1* | 11/2010 | Nakashima | 323/283 |
| 2011/0107122 A1* | 5/2011 | Wang et al. | 713/300 |
| 2011/0316524 A1* | 12/2011 | Kim et al. | 324/120 |

OTHER PUBLICATIONS

Pham et al., "Fault Diagnosis and PD-PWM Reconfiguration of a 5-Level Double-Boost PFC with Fault-Tolerant Capability" IECON 2010—36th Annual Conference on IEEE Industrial Electronics Society, Nov. 7-10, 2010, pp. 2839-2844 [online], [retrieved on Dec. 9, 2011]. Retrieved from the Internet <URL: http://ieeexplore.ieee.org/stamp/stamp.jsp?tp=&arnumber=5675074>.

* cited by examiner ional power converter. The method comprises providing a step-down conversion circuit that can receive current from an input bus connected to a power source via an input switch, reduce a voltage level of a received current via a voltage regulator comprised of a high-side switch and a low-side switch, and pass current from the voltage regulator to an output bus connected to a load via an ORing switch. The method further comprises, while the high-side switch is open to prevent current from passing through the high-side switch, and while the ORing switch is open to prevent current from passing through the ORing switch to or from the output bus, the power converter driving the low-side switch with a pulse-width modulation (PWM) signal to alternately open and close the low-side switch. The method further comprises, while the power converter is driving the low-side switch with the PWM signal, the power converter determining whether an under-voltage indicator is set which signifies that a detected voltage level of current from the voltage regulator is below a predetermined lower boundary voltage level. If the power converter determines that the under-voltage indicator is not set, the power converter determines that at least one of the one or more protection schemes is not operating properly.

TESTING PROTECTION SCHEMES OF A POWER CONVERTER

FIELD OF THE INVENTION

The present invention relates generally to protecting a load from a malfunctioning power converter and more particularly to testing existing protection schemes for the power converter.

BACKGROUND OF THE INVENTION

In a redundant power supply system, two or more power supply modules (power converters that convert electrical power from one form into another) have respective outputs connected in parallel to a single load via a common bus. Each power supply module has an associated ORing element (or switch), typically a field-effect transistor (FET) device, disposed between the output node of each module and the load. The ORing switches are operable to selectively couple or decouple the respective power supply module from the load, thereby effectively isolating current generated at the corresponding module from passing to the common bus. Similarly, each respective power supply module may have an associated input switch connecting the module to a power source. The respective switches are controlled to decouple associated power supply modules from the load and/or the power source upon detection of one or more of deficient operating conditions, each representing a failure occurring, or sub-optimal performance occurring in the system. The architecture of each respective power supply module of the system provides for a control circuit to direct the operation of the respective switches upon detection of one or more of these conditions. This may be referred to as "active ORing."

Active ORing does have draw-backs. A FET, when it is turned on, allows current to flow in either direction through its channel. If an input power source fails due to a short circuit, a large reverse current will be induced and will be allowed to flow through an ORing FET as long as its gate is enhanced. If the common bus is exposed to an input fault for a prolonged period of time, the bus voltage will discharge, thus bringing down the system. Because of this possibility, reverse current is one common operating condition that a power supply module monitors for. It is desirable that the active ORing solution is both accurate and capable of extremely fast detection of reverse current fault conditions. Once the fault has been detected, a controller is required to turn off the ORing FET as fast as possible, and thus, in turn, isolate the input fault from the common bus and prevent any further reverse current.

Similarly, if a short occurs within the power supply module, excessive current may be pulled down from an input bus (connecting the power source), via an input FET. Excessive forward current at the input FET is another operating condition monitored for, and if detected, the controller turns off the input FET.

Other common operating conditions that are monitored by the respective power supply modules include under-voltage (UV) conditions and over-voltage (OV) conditions. These are defined to be the limits within which the ORing switch and components of the system will properly operate. Such protections ensure that only a faulty power supply module or modules are isolated from the load, where, for example, a number of power supply modules are operating to provide voltage to the common bus.

SUMMARY

Aspects of an embodiment of the present invention disclose a method and system for verifying the operability of one or more protection schemes that prevent continued deficient operation of a power converter.

DETAILED DESCRIPTION

Figure 1:
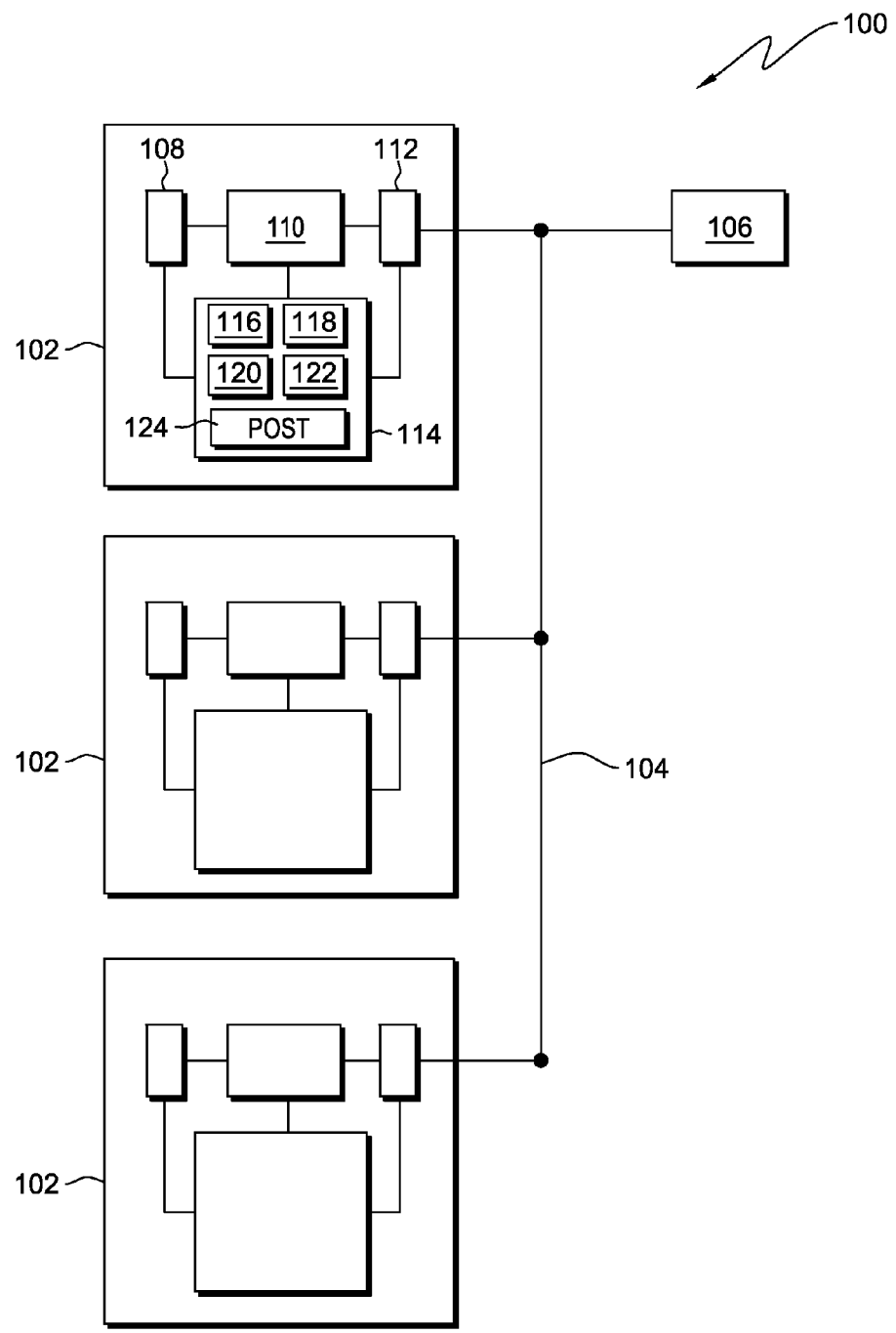
FIG. 1 illustrates a redundant power supply system, according to one embodiment of the present invention.

The present invention will now be described in detail with reference to the Figures. FIG. 1 illustrates a redundant power supply system, generally designated 100, according to one embodiment of the present invention.

Redundant power supply system 100 includes a plurality of redundant power supply modules 102. A power supply module (also known as a power converter) is a buffer circuit that provides power with the characteristics required by a load, from a primary power source with characteristics incompatible with the load. This might include AC to DC conversions and DC to DC conversions (converting a source of direct current from one voltage level to another). In short, a power supply module makes the load compatible with its power source. In the embodiment illustrated in FIG. 1, each power supply module 102 is connected to a common bus 104. Common bus 104, which may also be referred to as the output bus, is connected to load 106.

Each respective power supply module 102 contains input switch 108, connected to voltage regulator 110 (conversion circuitry in the form of a switching regulator), which in turn is connected to output switch 112. Input switch 108 controls whether current from a power source (not shown) is allowed to flow through to voltage regulator 110. Voltage regulator 110 converts the voltage level for compatibility with load 106. After conversion, output switch 112 selectively couples or decouples power supply module 102 to or from bus 104, allowing or preventing current flow between power supply module 102 and common bus 104.

Components from each respective power supply module 102, including input switch 108, voltage regulator 110, and output switch 112 are controlled by microcontroller 114, primarily through control signals. Alternatively, any control circuit may direct the operation of respective components 108, 110, and 112. Control logic governs the operation of microcontroller 114. Control logic is a sequence of steps required to perform a specific function, and, in the preferred embodiment, is implemented through firmware, typically low-level program instructions stored on a read only memory (ROM) or, alternatively, in whole or in part by computer circuits and other hardware. Protective functions 116, 118, 120, and 122 are protection schemes which respectively monitor for excessive forward current at input switch 108, reverse current at output switch 112, under-voltage from the power conversion process, and over-voltage from the power conversion process; and, in response, direct the operation of input switch 108 and output switch 112. The protective functions are discussed in more detail below.

Power on self test (POST) control logic 124 tests the operability of protective functions 116, 118, 120, 122 and in response to determining that one or more of the protective functions are operating incorrectly, isolates respective power supply module 102 from common bus 104. As its name suggests, POST control logic 124 executes when power supply module 102 is powered on. In an alternate embodiment, the tests may be run at various times. POST control logic 124 utilizes existing circuitry in power supply module 102.

In an alternate embodiment, power supply module 102 may have less than all four of the aforementioned protective functions (116, 118, 120, and 122). In such an embodiment, POST control logic 124 tests only the present protective functions.

Figure 2:
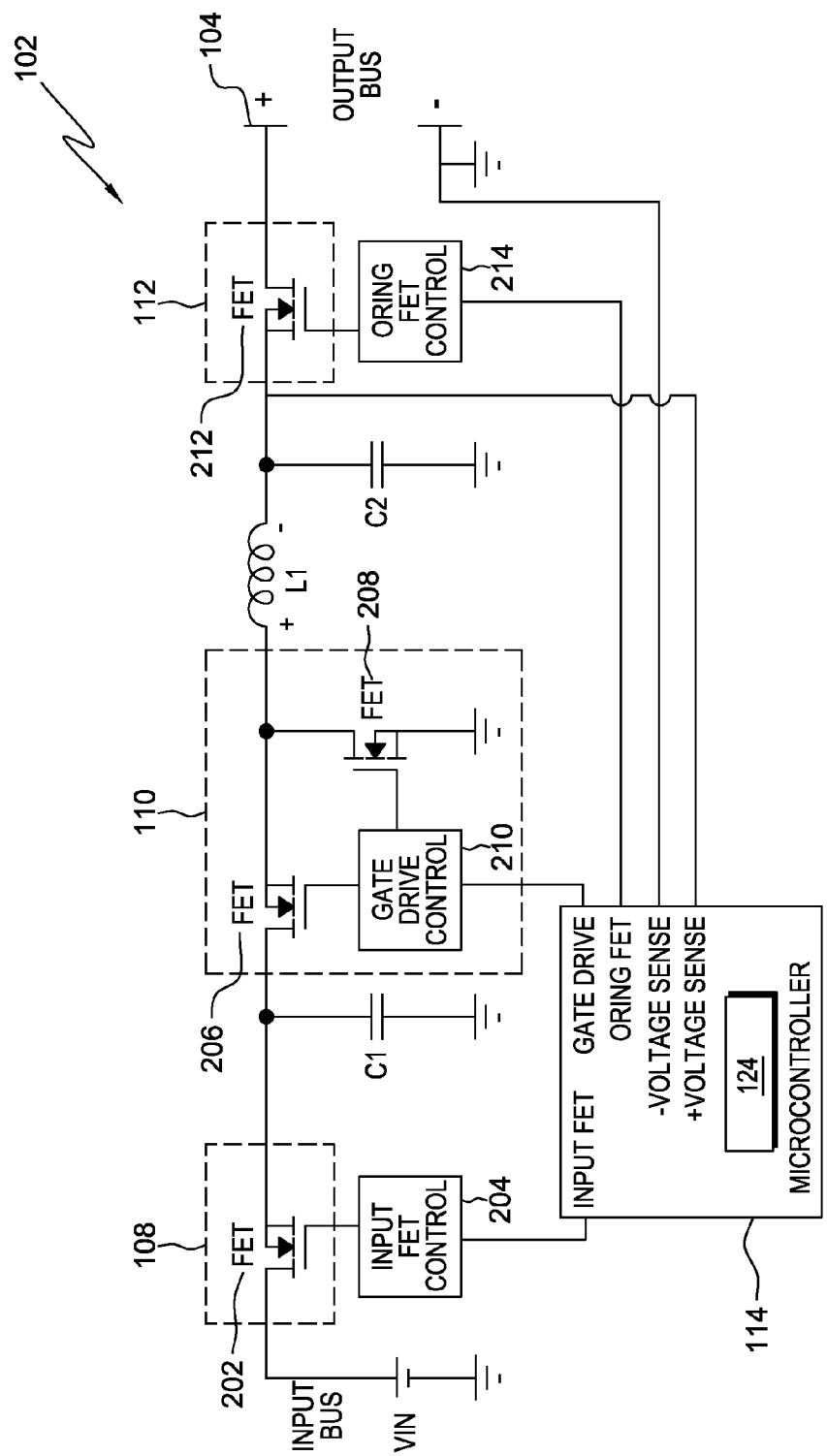
FIG. 2 provides a simplified circuit schematic of a power supply module from FIG. 1, in accordance with an illustrative embodiment.

FIG. 2 provides a simplified circuit schematic of a power supply module 102, in accordance with an illustrative embodiment.

Input switch 108 receives current from a power source, connected at VIN, via an input bus. Input switch 108 comprises field-effect transistor (FET) 202 (referred to herein as input FET 202) which when on (closed) allows current to flow through and when off (open) prevents the flow of current in either direction. When protective function 116 is operating properly, input FET 202 opens responsive to a short detected within power supply module 102, typically any short to ground at capacitor C1, FET 208, or capacitor C2. This prevents power supply module 102 from pulling down current from the input bus due to a short and ultimately bringing down or collapsing the input bus. Input FET control 204 is an integrated circuit that opens or closes input FET 202. In one embodiment, input FET control 204 may be thought of as a component of input switch 108 operating in response to direction from microcontroller 114 as determined by protective function 116 of FIG. 1. Alternatively, input FET control 204 may be considered a component of microcontroller 114.

Such a short can be detected as excessive forward current at input FET 202. A sensor (not shown) may be placed on either side of input FET 202 or integrated with input FET 202, and transmits information on current flow to microcontroller 114.

When input FET 202 is closed (on), current flows to voltage regulator 110. As depicted, power supply module 102 is a step-down (buck) converter, with voltage regulator 110 comprising a high-side load FET 206 and a low-side load FET 208. A high-side FET is controlled by an external enable signal and connects or disconnects a power source to a given load. A low-side FET is controlled by an external enable signal and connects or disconnects the load to ground (sinks current from the load). In normal operation, high-side FET 206 and low-side FET 208 operate in a synchronous mode, where both FET 206 and 208 are controlled by a pulse-width modulation (PWM) input signal. For example, when PWM is high, high-side FET 206 is on and low-side FET 208 is off. When PWM is low, high-side FET 206 is off and low-side FET 208 is on. By switching voltage to load 106 with the appropriate duty cycle, the output approximates a voltage at the desired level. Switching noise is filtered by inductor L1 and capacitor C2. Gate drive control 210 is an integrated circuit that controls (drives) enabling signals to FETs 206 and 208.

In an independent operating mode, gate drive control 210 can also independently control either high-side FET 206 or low-side FET 208, with the opposite FET being separately driven by the PWM signal. In one embodiment, the PWM signal and whether to control FET 206 or 208 independent of the PWM signal is determined by microcontroller 114 and relayed to gate drive control 210. In another embodiment, gate drive control 210 may be a component of microcontroller 114.

When protective functions 120 and 122 are operating correctly, a fault in conversion can be detected as a voltage level from voltage regulator 110 falling below an under-voltage value or rising past an over-voltage value. A sensor (not shown) may be placed at capacitor C2 and relays information on voltage to microcontroller 114 to compare with predetermined values as determined by protective functions 120 and 122. Responsive to a fault being detected, microcontroller 114 can direct input FET 202 and FET 212 to open, isolating power supply module 102 from common bus 104.

The converted power flows through output switch 112 to common bus 104. Output switch 112 comprises ORing FET 212 which connects power supply module 102 to common bus 104. When protective function 118 is operating properly, ORing FET 212 opens responsive to a short detected within power supply module 102, typically any short to ground at capacitor C2 or FET 208. This prevents power supply module 102 from pulling down current from common bus 104 due to a short and ultimately bringing down or collapsing common bus 104. ORing FET control 214 is an integrated circuit that opens or closes ORing FET 212. In one embodiment, ORing FET control 214 may be thought of as a component of output switch 112 operating in response to direction from microcontroller 114 as determined by protective function 118. Alternatively, ORing FET control 214 may be considered a component of microcontroller 114.

Such a short can be detected as negative (or reverse) current at ORing FET 212. A sensor (not shown) may be placed on either side of ORing FET 212 or integrated with ORing FET 212, and relays information on current flow to microcontroller 114. In response to detecting a negative current, microcontroller 114 directs ORing FET 212 to open, isolating power supply module 102 from common bus 104.

POST control logic 124 directs the operation of FETs 202, 206, 208, and 212 to simulate faulty operation and ensure that the protective functions operate correctly. More specifically, POST control logic 124 tests: 1) that input FET 202 opens if excessive forward current is detected (input series FET test); 2) that ORing FET 212 opens if reverse current is detected (ORing FET test); 3) that an under-voltage is detected where the converted voltage is below a given threshold (under-voltage test); and 4) that an over-voltage is detected where the converted voltage is above a given threshold (over-voltage test).

Figure 3:
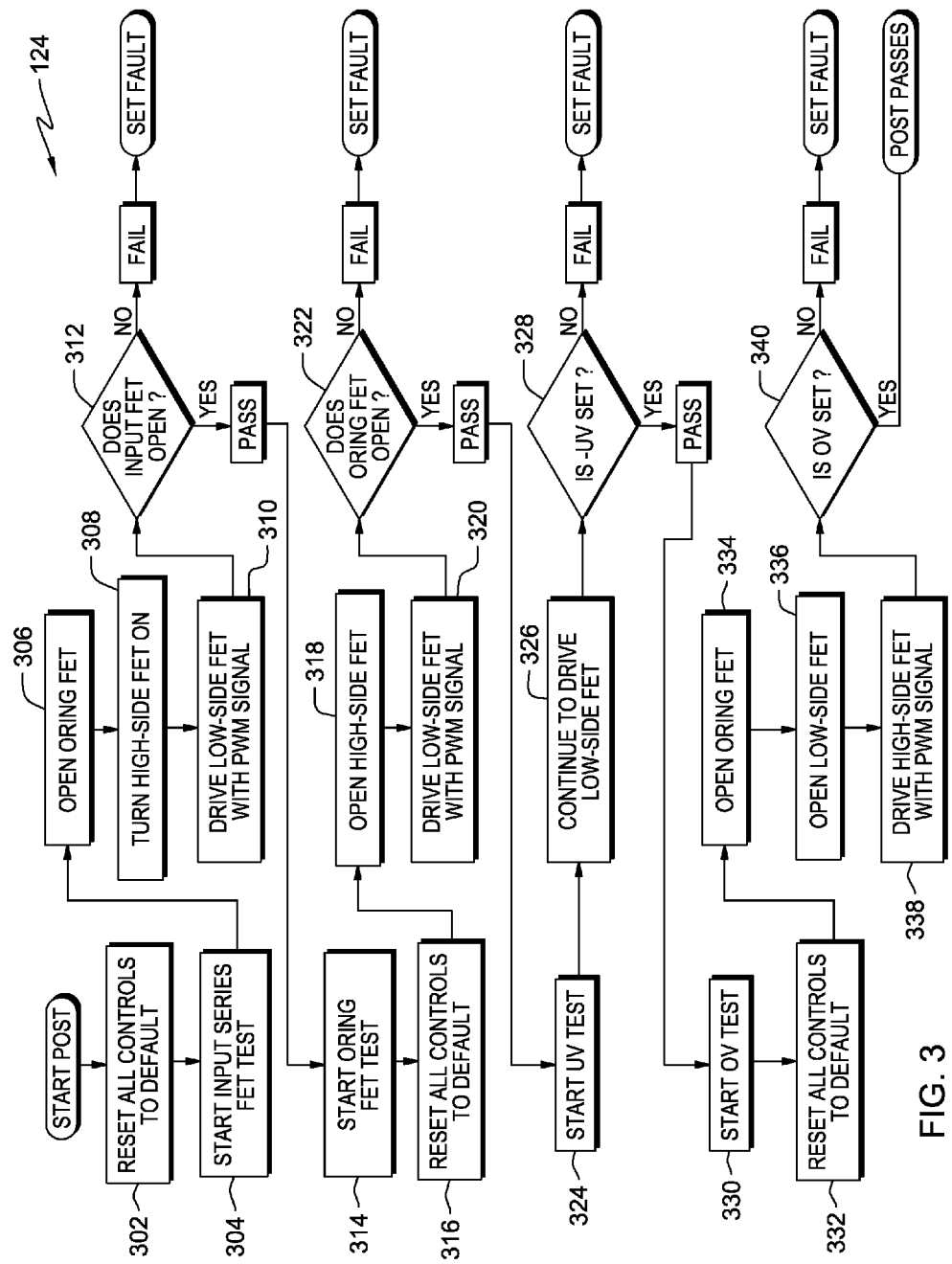
FIG. 3 is a flowchart of the steps of POST control logic, testing protection schemes of the power supply module from FIG. 2, in accordance with an embodiment of the present invention.

FIG. 3 is a flowchart of the steps of POST control logic 124, in accordance with an embodiment of the present invention. Though POST control logic 124 is shown testing the protective functions in a specific order, in alternate embodiments, the protective functions may be tested in any order. Additionally, in some embodiments, one or more of the protective functions may not be tested.

POST 124 begins by setting all controls (i.e., input FET control 204, gate drive control 210, and ORing FET control 214) to a default state (step 302). A person of ordinary skill in the art will recognize that POST 124 performs an action by sending one or more signals to the appropriate control circuit (i.e., input FET control 204, gate drive control 210, and ORing FET control 214), and the control circuit responds to the one or more signals by opening or closing FETs 202, 206, 208, and 212 as indicated by the one or more signals. In the default state, the input FET 202 is on, high-side FET 206 and low-side FET 208 are being driven by a PWM signal alternately switching FETs 206 and 208 on and off to approximate the desired output voltage, and ORing FET 212 is on. From the default state, any of the protective element tests may be initialized. In the present embodiment, POST 124 initializes an input series FET test (step 304).

Figure 4:
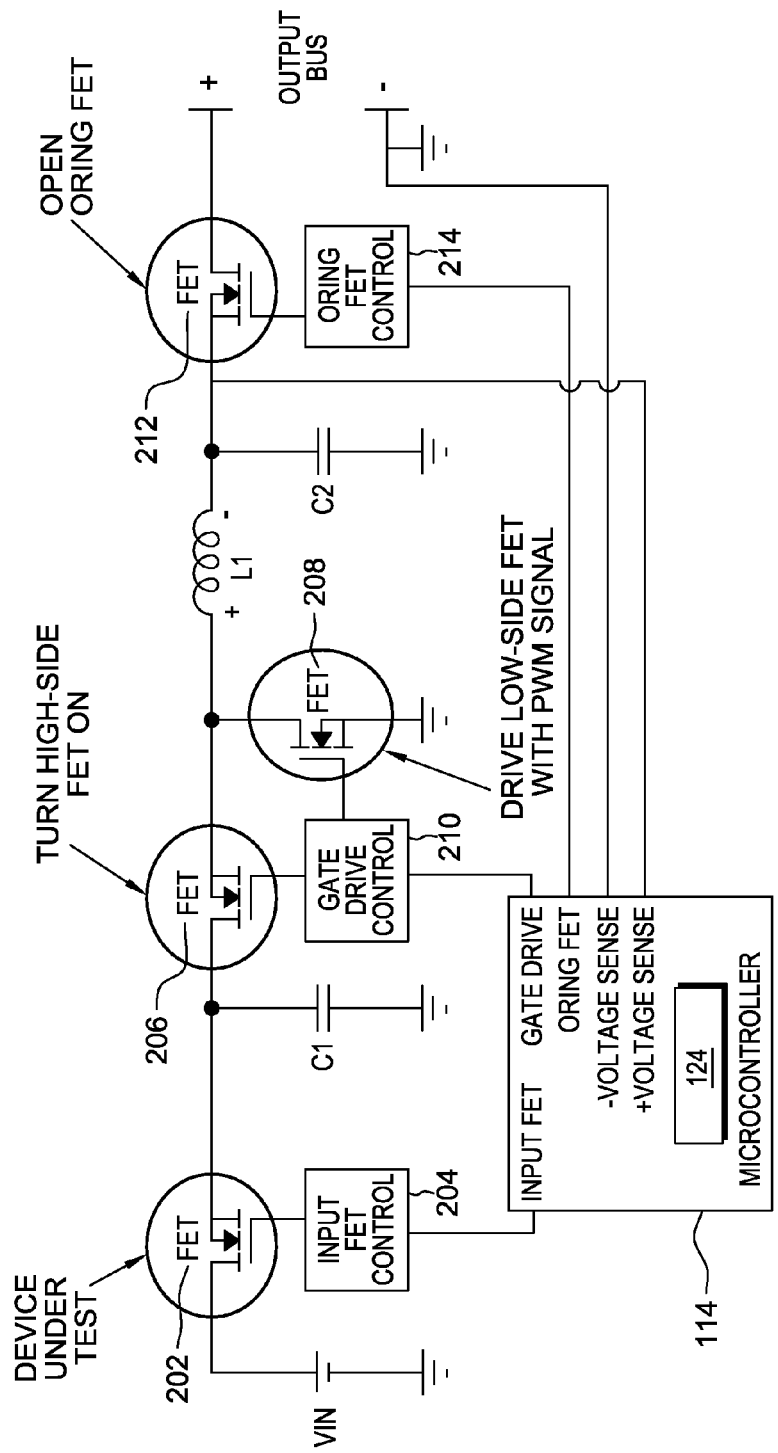
FIG. 4 illustrates the state of circuitry of the power supply module from FIG. 2 when implementing an input series FET test, in accordance with an embodiment of the present invention.
Figure 5:
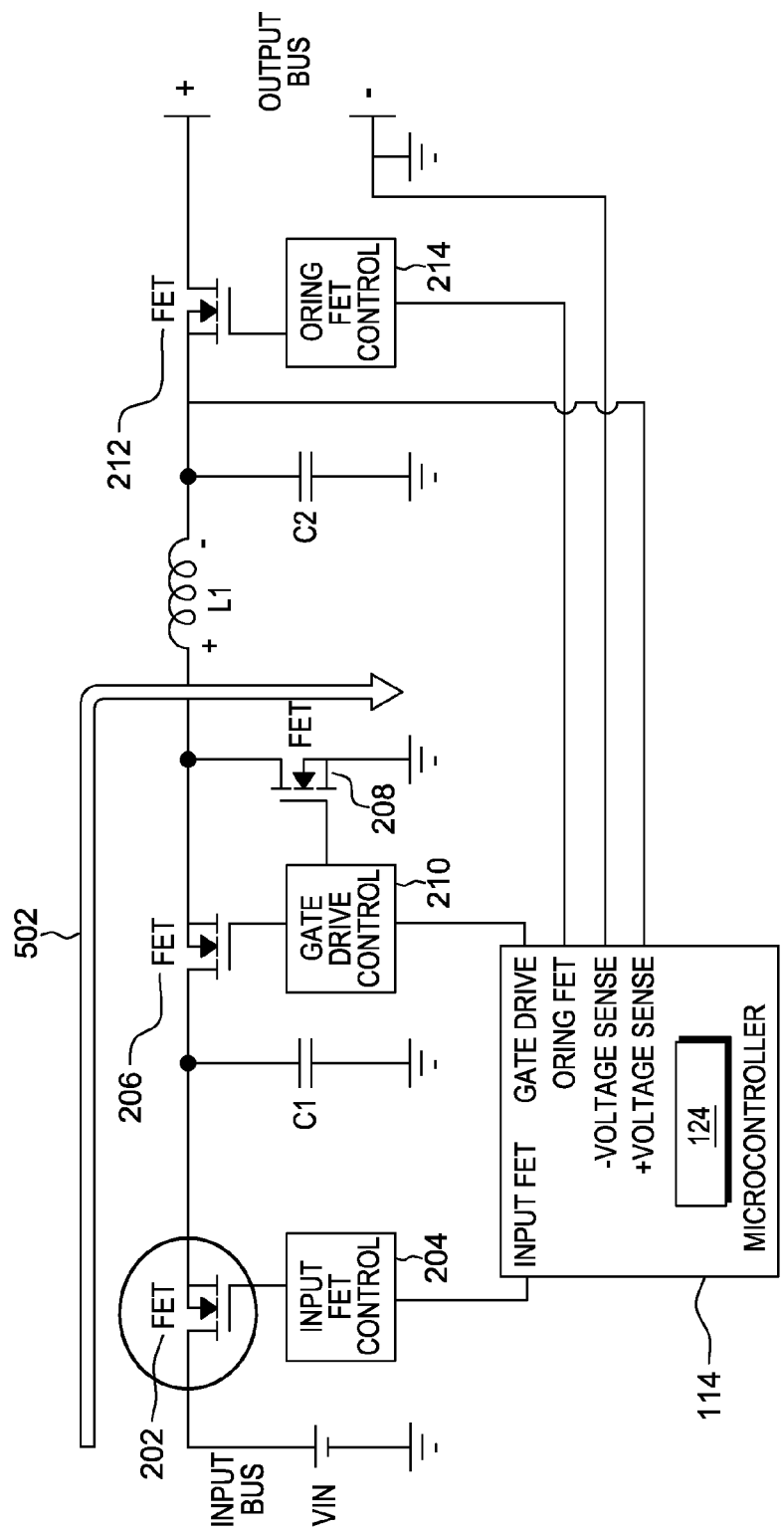
FIG. 5 depicts current flow through the circuitry of the power supply module when in the state illustrated by FIG. 4.

POST 124 opens ORing FET 212 (step 306). POST 124 turns on high-side FET 206 (step 308) independent of low-side FET 208. POST 124 drives low-side FET 208 with the PWM signal (step 310) while high-side FET 206 remains on. In this state, current flows through input FET 202, through high-side FET 206 and with ORing FET 212 being off, is pulled to ground by the alternating connection to ground at low-side FET 208. This simulates a short to ground in power supply module 102 which increases the forward current at input FET 202. If protective function 116 operates properly, input FET 202 should open (turn off). The circuit schematic of this orientation is shown in FIGS. 4 and 5, and is discussed in a subsequent section.

POST 124 determines if input FET 202 opens (decision block 312). If input FET 202 does not open (no branch of decision 312), then protective function 116 has failed and POST 124 sets a fault. The fault triggers the isolation of power supply module 102 from the system, typically by opening both input FET 202 and ORing FET 212. In one embodiment, a specific fault code is associated with a specific failed testing scheme and microcontroller 114 determines which test failed and sets the fault with the appropriate fault code, allowing for a quicker failure analysis. If input FET 202 does open (yes branch of decision 312), then protective function 116 has passed and POST 124 moves to the next protective function test.

Figure 6:
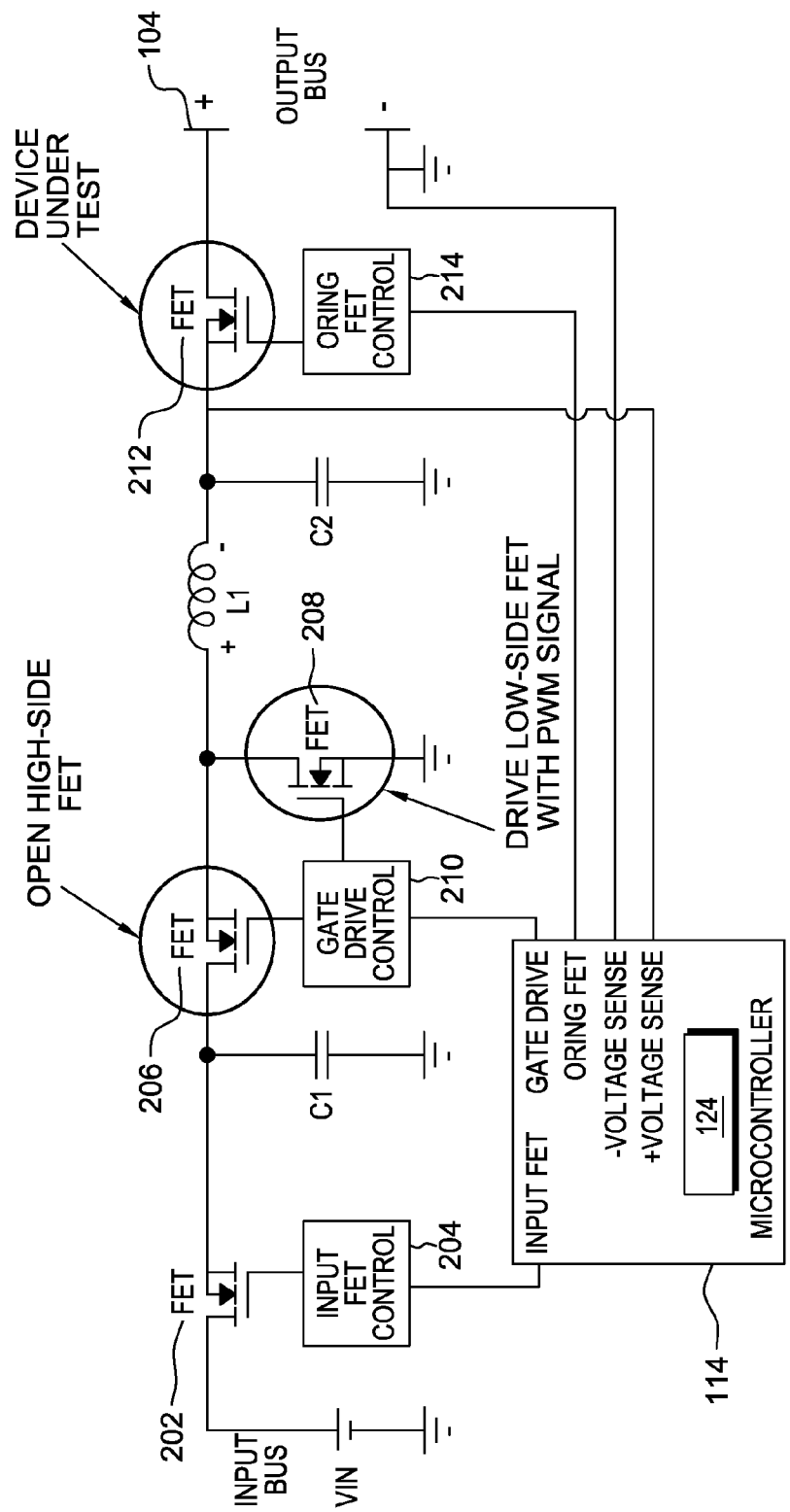
FIG. 6 illustrates the state of the circuit when implementing an ORing FET test, in accordance with an embodiment of the present invention.
Figure 7:
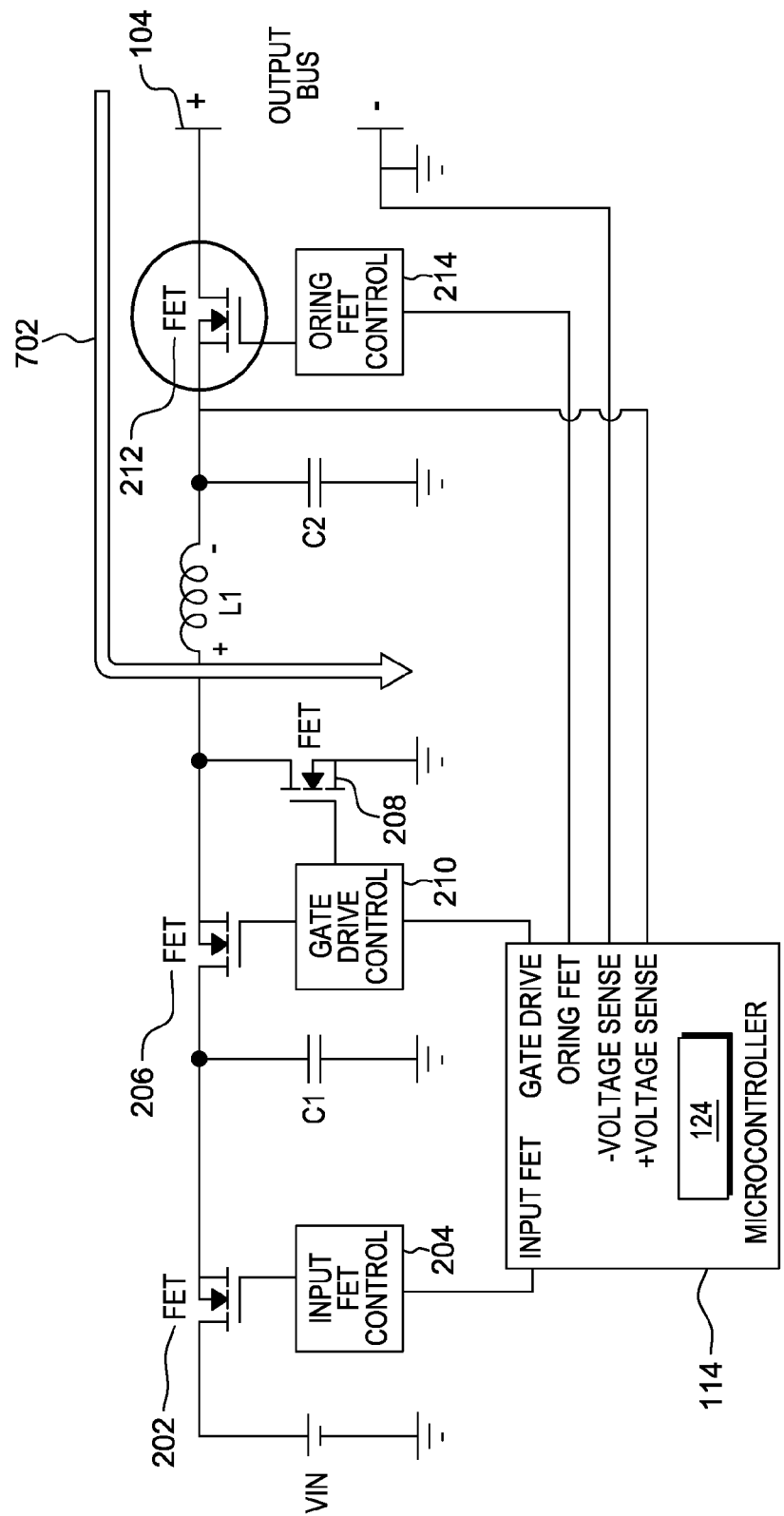
FIG. 7 depicts current flow through the circuitry of the power supply module when in the state illustrated by FIG. 6.

POST 124 initiates an ORing FET 212 test (step 314) and resets all controls to the default state (step 316). POST 124 opens high-side FET 206 (step 318) blocking a path to and from the power source and with ORing FET 212 on (from the default state), drives low-side FET 208 with the PWM signal (step 320). This simulates a power supply module failure and begins to pull down common bus 104, connected via ORing FET 212, to ground. If protective function 118 is operating properly, ORing FET 212 should open, isolating power supply module 102 from common bus 104. The circuit schematic of this orientation is shown in FIGS. 6 and 7, and is discussed in a subsequent section.

POST 124 determines if ORing FET 212 opens (decision block 322). If ORing FET 212 does not open (no branch of decision 322), then protective function 118 has failed and POST 124 sets a fault. Again, the fault triggers the isolation of power supply module 102 from the system, typically by opening both input FET 202 and ORing FET 212. If ORing FET 212 does open (yes branch of decision 322), then protective function 118 has passed and POST 124 moves to the next protective function test.

Figure 8:
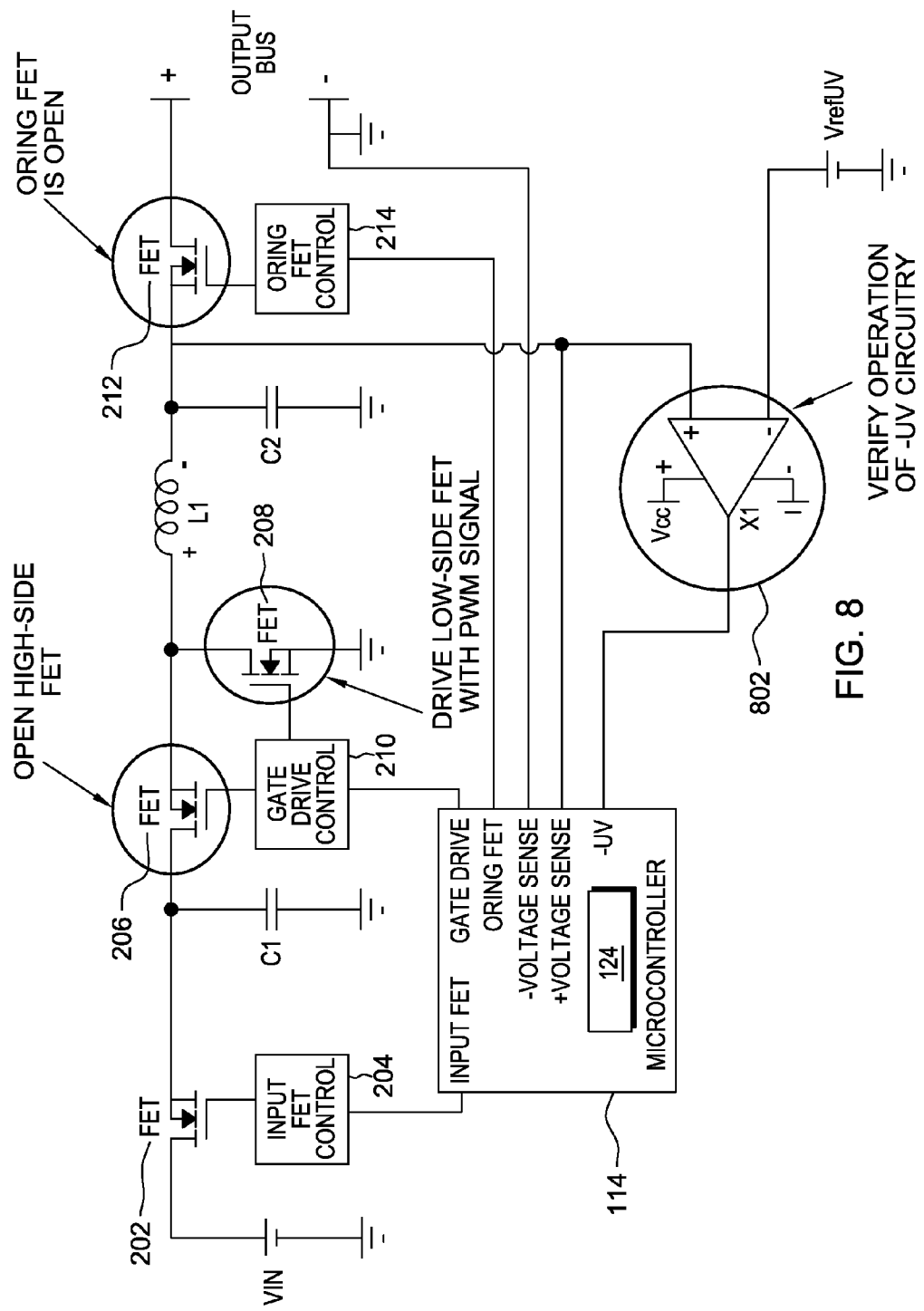
FIG. 8 illustrates the state of the circuit when implementing an under-voltage test, in accordance with an embodiment of the present invention.

POST 124 initiates an under-voltage test (step 324). As a result of the ORing FET test, the state of the circuit is high-side FET 206 open, low-side FET 208 being driven by the PWM signal, and ORing FET 212 open. This is the proper state for testing under-voltage detection, so the controls need not be reset and POST 124 continues to drive low-side FET 208 with the PWM signal (step 326). In an alternate embodiment, POST 124 may set the controls to the default state and subsequently open high-side FET 206 and ORing FET 212 prior to driving low-side FET 208 with the PWM signal. This would likely be the case if the tests performed by POST 124 are executed in a different order. The circuit schematic of this orientation is shown in FIG. 8, and is discussed in a subsequent section.

This state simulates the voltage after conversion being lower than any likely threshold under-voltage value and should cause an under-voltage indicator to be set. POST 124 determines whether the under-voltage indicator is set (decision block 328), and in response to determining that the under-voltage indicator is not set (no branch of decision 328), sets a fault. In response to determining that the under-voltage indicator is set (yes branch of decision 328), the under-voltage test passes and POST 124 tests the next protective function.

Figure 9:
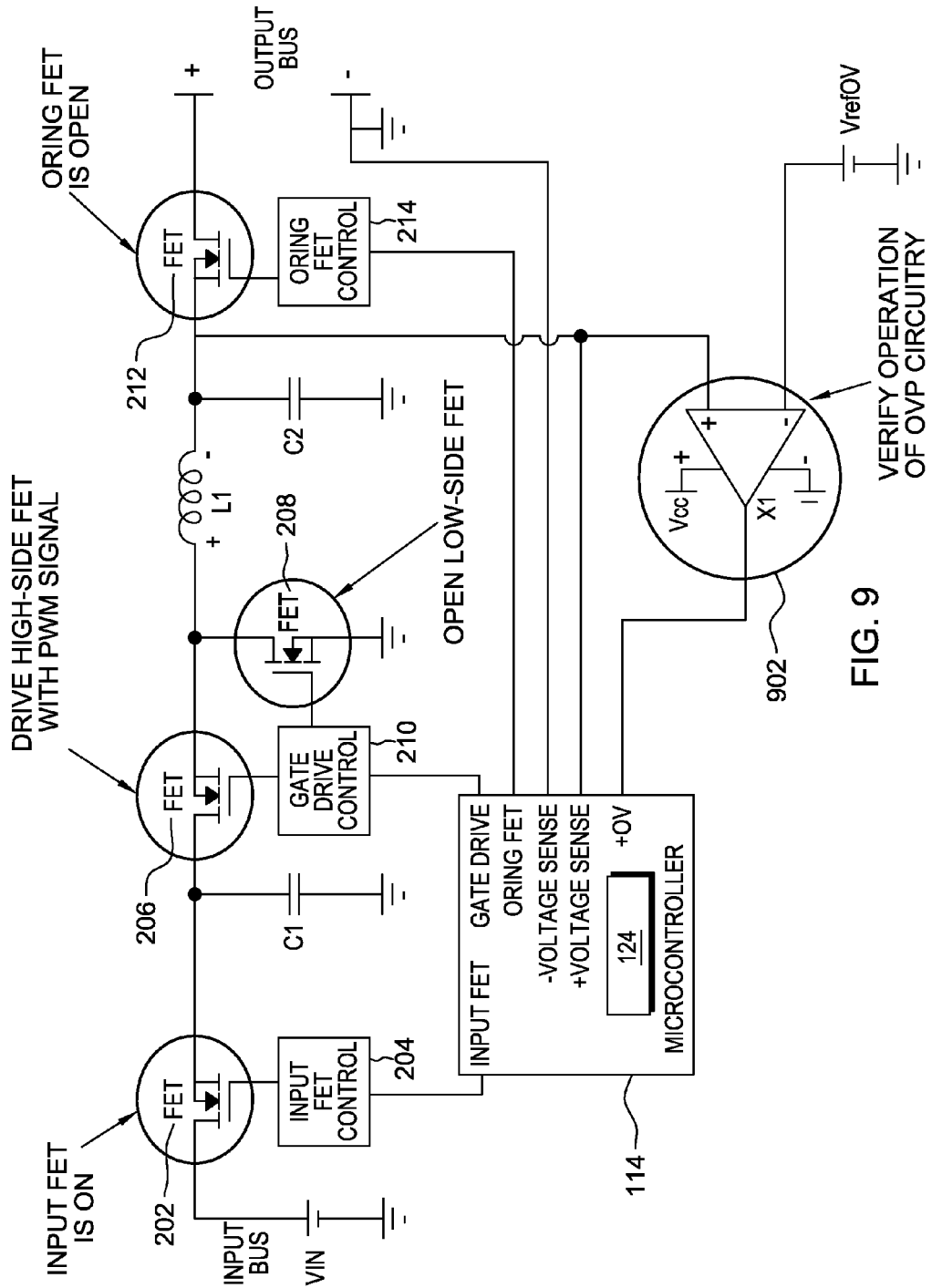
FIG. 9 illustrates the state of the circuit when implementing an over-voltage test, in accordance with an embodiment of the present invention.

POST 124 initiates an over-voltage test (step 330). POST 124 resets all controls to the default state (step 332). POST 124 opens ORing FET 212 (step 334) and low-side FET 208 (step 336). With FET 212 and 208 turned off, POST 124 drives high-side FET 206 with the PWM signal (step 338). This simulates excessive voltage after conversion and should be higher than any threshold over-voltage value, causing an over-voltage indicator to be set. The circuit schematic of this orientation is shown in FIG. 9 and is discussed in a subsequent section.

POST 124 determines whether the over-voltage indicator is set (decision block 340), and in response to determining that the over-voltage indicator is not set (no branch of decision 340), sets a fault. In response to determining that the over-voltage indicator is set (yes branch of decision 340), the over-voltage test passes. In the depicted embodiment, now all POST 124 tests have passed, and operation of power supply module 102 may proceed normally.

FIG. 4 illustrates the state of the circuit when implementing the input series FET test, in accordance with an embodiment of the present invention. Input FET 202 is the device being tested and begins in an "on" state. High-side FET 206 is also in an "on" state. ORing FET 212 is "off" or open. Low-side FET 208 is being driven by the PWM signal.

FIG. 5 depicts current flow through the circuitry of power supply module 102 when in the state illustrated by FIG. 4.

Current 502 flows from a power source directly through input FET 202 and high-side FET 206. No path exists for current 502 to pass through ORing FET 212. The PWM signal driving low-side FET 208 repeatedly completes a path to ground for current 502. This flow to ground simulates a short leading to excessive forward current at input FET 202 and input FET 202 should open in response.

FIG. 6 illustrates the state of the circuit when implementing the ORing FET test, in accordance with an embodiment of the present invention. Input FET 202 begins in an "on" state. For this specific test, however, that state of input FET 202 is irrelevant and in an alternative embodiment, may begin in an "off" state. High-side FET 206 is in an "off" state. ORing FET 212 is "on". Low-side FET 208 is being driven by the PWM signal.

FIG. 7 depicts current flow through the circuitry of power supply module 102 when in the state illustrated by FIG. 6. Opposite the flow of current 502 in FIG. 5 where current from the power source was being pulled to ground, here low-side FET 208 is repeatedly connecting the load to ground pulling down current from common bus 104 and causing current 702 to run in reverse from the load to the ground. This negative current flow simulates a short in power supply module 102. ORing FET 212 should open in response.

FIG. 8 illustrates the state of the circuit when implementing the under-voltage test, in accordance with an embodiment of the present invention. Input FET 202 begins in an "on" state. Similar to the ORing FET test, however, that state of input FET 202 is irrelevant and in an alternative embodiment, may begin in an "off" state. High-side FET 206 is in an "off" state. ORing FET 212 is also "off". Low-side FET 208 is being driven by the PWM signal, ensuring that any detected voltage is below the threshold under-voltage value. Circuitry 802 depicts a comparator (in this case a differential amplifier) which compares the voltage from C2 with a voltage representing the under-voltage threshold. Responsive to the under-voltage test described above, an under-voltage sensor should be set if protective function 120 is operating properly.

FIG. 9 illustrates the state of the circuit when implementing the over-voltage test, in accordance with an embodiment of the present invention. Input FET 202 begins in an "on" state. High-side FET 206 is being driven by the PWM signal and low-side FET 208 on in an "off" state. ORing FET 212 is also "off". This ensures that any detected voltage is above the threshold over-voltage value. Circuitry 902 depicts a comparator which compares the voltage from C2 with a voltage representing the over-voltage threshold. Responsive to the over-voltage test described above, an over-voltage sensor should be set if protective function 122 is operating properly.

Based on the foregoing, a method and system have been disclosed for verifying the operability of protection schemes in a power converter. However, numerous modifications and substitutions can be made without deviating from the scope of the present invention. In this regard, each block in the flowcharts or block diagrams may represent a module, segment, or portion of control logic for implementing the specified logical function(s). It should also be noted that, in some alternative implementations, the functions noted in the blocks may occur out of the order noted in the figures. Therefore, the present invention has been disclosed by way of example and not limitation.

What is claimed is:

1. A method for verifying the operability of one or more protection schemes that prevent continued deficient operation of a power converter, the method comprising the steps of:
providing the power converter which can receive current from an input bus connected to a power source via an input switch, reduce a voltage level of a received current via a voltage regulator comprised of a high-side switch and a low-side switch, and pass current from the voltage regulator to an output bus connected to a load via an ORing switch;

the power converter simulating at least one deficient operating condition from a group of deficient operating conditions by driving either the high-side switch or the low-side switch with a pulse-width modulation (PWM) signal, while the remaining of the input switch, the high-side switch, the low-side switch, and the ORing switch are each in a predetermined opened or closed state, wherein the group of deficient operating conditions include: excessive forward current at the input switch, reverse current at the output switch, a detected voltage level of current from the voltage regulator below a predetermined lower boundary voltage level, and a detected voltage level of current from the voltage regulator above a predetermined upper boundary voltage level; and the power converter determining whether a protection scheme used to prevent continued deficient operation of the power converter responds properly to the simulated at least one deficient operating condition.

2. The method of claim 1, wherein the step of the power converter simulating the at least one deficient operating condition and the step of the power converter determining whether the protection scheme responds properly to the simulated at least one deficient operating condition, comprise:

while the high-side switch is open to prevent current from passing through the high-side switch, and while the ORing switch is open to prevent current from passing through the ORing switch to or from the output bus, the power converter driving the low-side switch with the PWM signal to alternately open and close the low-side switch;

while the power converter is driving the low-side switch with the PWM signal, the power converter determining whether an under-voltage indicator is set which signifies that a detected voltage level of current from the voltage regulator is below the predetermined lower boundary voltage level; and if the power converter determines that the under-voltage indicator is not set, the power converter determining that the protection scheme is not operating properly.

3. The method of claim 2, further comprising the step of, prior to the step of the power converter driving the low-side switch with the PWM signal while the high-side switch is open and the ORing switch is open, the power converter opening one or both of the high-side switch and the ORing switch.

4. The method of claim 1, wherein the step of the power converter simulating the at least one deficient operating condition and the step of the power converter determining whether the protection scheme responds properly to the simulated at least one deficient operating condition, comprise:

while the input switch is closed, and while the low-side switch is open, and while the ORing switch is open, the power converter driving the high-side switch with the PWM signal to alternately open and close the high-side switch;

while the power converter is driving the high-side switch with the PWM signal, the power converter determining whether an over-voltage indicator is set which signifies that a detected voltage level of current from the voltage regulator is above the predetermined upper boundary voltage level; and if the power converter determines that the over-voltage indicator is not set, the power converter determining that the protection scheme is not operating properly.

5. The method of claim 4, further comprising the step of, prior to the step of the power converter driving the high-side switch with the PWM signal while the input switch is closed and the low-side switch and the ORing switch are open, the power converter opening one or both of the low-side switch and the ORing switch.

6. The method of claim 4, further comprising the step of, prior to the step of the power converter driving the high-side switch with the PWM signal while the input switch is closed and the low-side switch and the ORing switch are open, the power converter closing the input switch.

7. The method of claim 1, wherein the step of the power converter simulating the at least one deficient operating condition and the step of the power converter determining whether the protection scheme responds properly to the simulated at least one deficient operating condition, comprise:
while the input switch is closed to allow current to flow from the power source to the power converter, and while the high-side switch is closed, and while the ORing switch is open, the power converter driving the low-side switch with the PWM signal to cause excessive forward current at the input switch;
while the power converter is driving the low-side switch with the PWM signal, with the input switch and the high-side switch closed and the ORing switch open, the power converter detecting whether the input switch opens; and
if the power converter detects that the input switch stays closed while the power converter is driving the low-side switch with the PWM signal, the power converter determining that the protection scheme is not operating properly.

8. The method of claim 7, further comprising the step of, prior to the power converter driving the low-side switch with the PWM signal while the input switch and the high-side switch are closed and the ORing switch is open, the power converter closing one or both of the input switch and the high-side switch.

9. The method of claim 7, further comprising the step of, prior to the power converter driving the low-side switch with the PWM signal while the input switch and the high-side switch are closed and the ORing switch is open, the power converter opening the ORing switch.

10. The method of claim 1, wherein the step of the power converter simulating the at least one deficient operating condition and the step of the power converter determining whether the protection scheme responds properly to the simulated at least one deficient operating condition, comprise:
while the high-side switch is open, and while the ORing switch is closed, the power converter driving the low-side switch with the PWM signal to cause a reverse current at the ORing switch;
while the power converter is driving the low-side switch with the PWM signal, with the high-side switch open and the ORing switch closed, the power converter detecting whether the ORing switch opens; and
if the power converter detects that the ORing switch stays closed while the power converter is driving the low-side switch with the PWM signal, the power converter determining that the protection scheme is not operating properly.

11. The method of claim 10, further comprising the step of, prior to the power converter driving the low-side switch with the PWM signal while the high-side switch is open and the ORing switch is closed, the power converter opening the high-side switch.

12. The method of claim 10, further comprising the step of, prior to the power converter driving the low-side switch with the PWM signal while the high-side switch is open and the ORing switch is closed, the power converter closing the ORing switch.

13. The method of claim 1, wherein the input switch, the high-side switch, the low-side switch, and the ORing switch each comprise a field-effect transistor.

14. The method of claim 1, further comprising the step of, in response to determining that the protection scheme does not respond properly to the simulated at least one deficient operating condition, the power converter isolating the power converter from the output bus by opening the ORing switch.

15. The method of claim 1, further comprising the step of, in response to determining that the protection scheme does not respond properly to the simulated at least one deficient operating condition, the power converter isolating the power converter from the input bus by opening the input switch.

16. A power converter comprising:
an input switch to couple to a power source via an input bus;
a voltage regulator comprised of a high-side switch and a low-side switch;
an ORing switch to couple to a load via an output bus;
wherein the power converter is operable to:
simulate at least one deficient operating condition from a group of deficient operating conditions by driving either the high-side switch or the low-side switch with a pulse-width modulation (PWM) signal, while the remaining of the input switch, the high-side switch, the low-side switch, and the ORing switch are each in a predetermined opened or closed state, wherein the group of deficient operating conditions include: excessive forward current at the input switch, reverse current at the output switch, a detected voltage level of current from the voltage regulator below a predetermined lower boundary voltage level, and a detected voltage level of current from the voltage regulator above a predetermined upper boundary voltage level; and
determine whether a protection scheme used to prevent continued deficient operation of the power converter responds properly to the simulated at least one deficient operating condition.

17. The power converter of claim 16, wherein the power converter is further operable to:
open the high-side switch and the ORing switch;
drive the low-side switch with the PWM signal to alternately open and close the low-side switch while the high-side switch and the ORing switch are open;
determine whether an under-voltage indicator is set which signifies that a voltage level of current from the voltage regulator is below the predetermined lower boundary voltage level; and
responsive to determining that the under-voltage indicator is not set, determine that a protection scheme is not operating properly.

18. The power converter of claim 16, wherein the power converter is further operable to:
close the input switch;
open the low-side switch;
open the ORing switch;

drive the high-side switch with the PWM signal to alternately open and close the high-side switch while the input switch is closed and the low-side switch and the ORing switch are open;

determine whether an over-voltage indicator is set which signifies that a voltage level of current from the voltage regulator is above the predetermined upper boundary voltage level; and responsive to determining that the over-voltage indicator is not set, determine that a protection scheme is not operating properly.

19. The power converter of claim 16, wherein the power converter is further operable to:

close the input switch;
close the high-side switch;
open the ORing switch;
drive the low-side switch with the PWM signal while the input switch and the high-side switch are closed and the ORing switch is open, and in response, detect whether the input switch opens; and
responsive to the input switch staying closed, determine that a protection scheme is not operating properly.

20. The power converter of claim 16, wherein the power converter is further operable to:

open the high-side switch;
close the ORing switch;
drive the low-side switch with the PWM signal while the high-side switch is open and the ORing switch is closed, and in response, detect whether the ORing switch opens; and
responsive to the ORing switch staying closed, determine that a protection scheme is not operating properly.

21. The power converter of claim 16, wherein the power converter is further operable to:

responsive to determining that a protection scheme is not operating properly, isolate the power converter from the output bus by opening the ORing switch.

22. The power converter of claim 16, wherein the power converter is further operable to:

responsive to determining that a protection scheme is not operating properly, isolate the power converter from the input bus by opening the input switch.

* * * * *